United States Patent [19]

Skelton

[11] 4,184,105
[45] Jan. 15, 1980

[54] VERTICAL DEFLECTION DRIVE CIRCUIT

[75] Inventor: Merle D. Skelton, Fort Wayne, Ind.

[73] Assignee: The Magnavox Company, Fort Wayne, Ind.

[21] Appl. No.: 826,507

[22] Filed: Aug. 22, 1977

[51] Int. Cl.² .................... H01J 29/70; H01J 29/76
[52] U.S. Cl. .................................................... 315/397
[58] Field of Search .............................. 315/396, 397

[56] References Cited

U.S. PATENT DOCUMENTS

| | | | |
|---|---|---|---|
| 3,784,857 | 1/1974 | Christopher | 315/396 |
| 3,921,036 | 11/1975 | Morio et al. | 315/396 |
| 4,055,784 | 10/1977 | Tanaka | 315/397 |

Primary Examiner—Theodore M. Blum
Attorney, Agent, or Firm—Thomas A. Briody; William J. Streeter

[57] ABSTRACT

A vertical drive circuit is provided for supplying a current to a deflection yoke in a CRT display. The vertical drive circuit provides a first voltage which when applied to a deflection yoke will cause the electron beam to be deflected from the top of the screen to the bottom. A retrace circuit supplies a second voltage which will cause the beam to be returned to the top of the screen at the conclusion of a complete vertical scan.

5 Claims, 6 Drawing Figures

VERTICAL DEFLECTION DRIVE CIRCUIT

BACKGROUND OF THE INVENTION

The apparatus of the present invention relates to the deflection circuit art for a CRT display apparatus. Specifically, a vertical drive circuit for providing current to a vertical deflection yoke is described.

Cathode ray tubes (CRT's) appear in many display devices known in the art. In order to deflect a beam produced by a CRT, it is necessary to apply either an electric or a magnetic field to the CRT in both the horizontal and vertical axes. In the television receiver art, a magnetic field is used to move the electron beam from the top of the screen to the bottom. The magnetic field is generated by a vertical deflection yoke known to those skilled in the art.

The vertical deflection yoke requires a current for positioning the electron beam along the vertical axis. A linearly changing current produces a change in the position of the beam. In the television art, the current is initially established so that the beam is at the top of the screen. The current is thereafter changed, forcing the beam to move towards the bottom of the CRT. During this time, referred to as the "trace" period, an image is formed on the CRT.

At the conclusion of the trace period, the current through the deflection yoke is rapidly changed to return the electron beam to the top of the picture tube. During this retrace period, the beam is shut off or "blanked" so that no image is formed during retrace.

The power dissipation in the drive circuitry associated with the yoke has been regarded as excessive by those skilled in the art. In the past, power efficiency has been improved by using a lower source of voltage for driving current through the yoke during the trace period and using a much higher voltage for driving current through the yoke during retrace.

To carry out this technique, a separate power supply has been used in the past to supply a much higher voltage to the yoke during retrace. By using two separate power supplies, voltage on drive circuitry may be kept lower during trace, thereby keeping power consumption to a minimum. The additional power supply, however, adds weight and cost.

SUMMARY OF INVENTION

Apparatus is provided for supplying a current to a deflection yoke for deflecting an electron beam in a television picture tube or other cathode ray tube.

The apparatus receives vertical oscillator pulses indicating the beginning and end of a trace period. A linearly changing voltage waveform is generated during the trace period. The voltage waveform is coupled to a deflection yoke thereby inducing a linearly changing current waveform.

A voltage multiplier is used to provide a higher potential to the yoke during the retrace period. The higher potential is derived in one embodiment of the present invention by use of a doubler circuit connected to an existing supply of d.c. voltage, thereby eliminating the need for a second power supply.

DESCRIPTION OF THE PREFERRED EMBODIMENT

Figure 1:
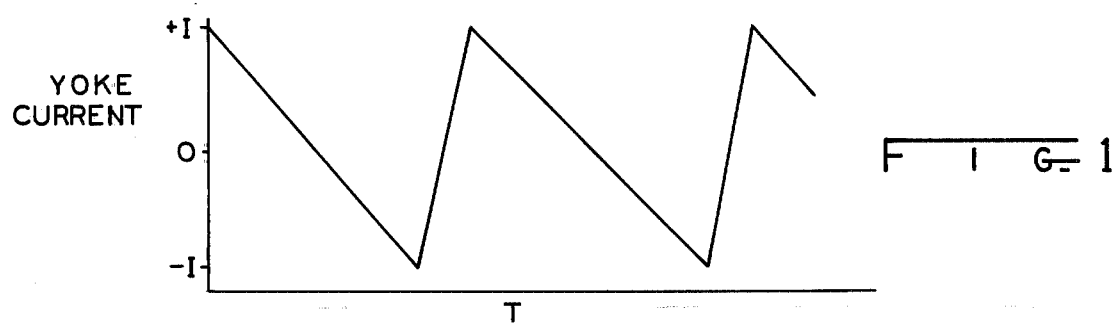
FIG. 1 illustrates the waveform of current required for a deflection yoke in a television receiver.

Referring now to FIG. 1, there is shown generally a waveform describing the current required by a deflection yoke to completely scan the vertical field on a television picture tube. This scan current waveform is supplied by the apparatus of this invention and is comprised of two portions, a trace portion and a smaller retrace portion. The trace portion comprises a decreasing current which begins at a current value of $+I$, decreases to 0, and reverses direction, decreasing to a value of $-I$. The electron beam on the television tube is during this time interval deflected from the top of the picture tube to the center and thence to the bottom of the picture tube. The current is thereafter reset during the retrace portion to a value of $+I$. This corresponds to the return of the electron beam to the top of the screen. Once the beam has been returned, the sequence may be started over again. During the retrace period, the electron beam is turned off so that a viewer does not see the beam being returned to the top of the screen. During this interval, called the blanking interval, a "blanking" pulse is supplied to other circuitry known to those skilled in the art which causes the electron beam to be shut off.

Figure 2:
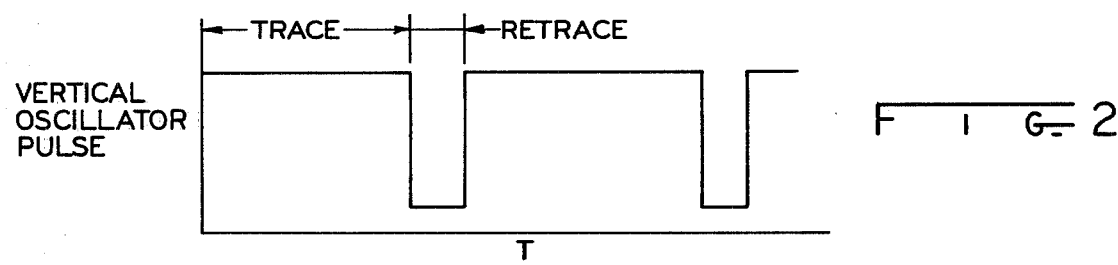
FIG. 2 represents vertical oscillator pulses supplied to a drive circuit for initiating and sustaining a yoke current.

Referring now to FIG. 2, there is shown an input voltage waveform which the present invention converts into a yoke current. The input waveform is derived from a vertical oscillator and comprises a pulse having a d.c. voltage which specifies the trace period. At the conclusion of the trace period, an abrupt change in d.c. voltage indicates retrace is to begin. The waveform shown in FIG. 2 is supplied to the input of the present invention and is thereafter converted into the requisite current.

Figure 3:
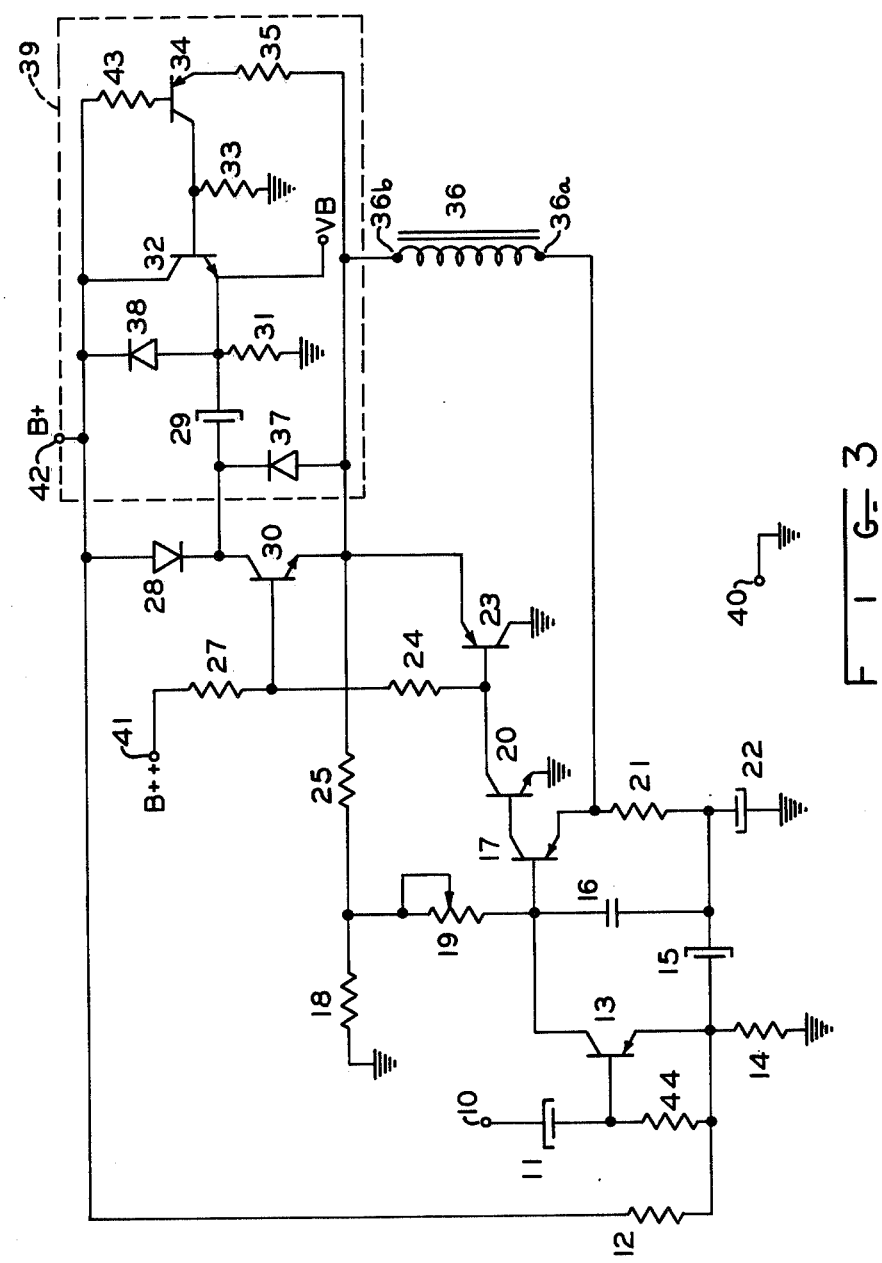
FIG. 3 is a schematic drawing of one embodiment of the present invention used to generate a yoke current.

Referring now to FIG. 3, there is shown a preferred embodiment of the present invention for converting vertical oscillator pulses into a yoke current for deflecting in the vertical direction the electron beam in a television picture tube. Terminal 10 receives the vertical oscillator pulses and capacitor 11 couples these vertical oscillator pulses to the base of a transistor 13. During the trace portion of the vertical oscillator pulse, transistor 13 is biased off and is nonconducting. The retrace portion of the vertical oscillator pulse biases transistor 13 on causing the capacitor 16 to receive an initial voltage. The magnitude of the voltage is determined by a voltage divider comprising resistor 12 and resistor 14. The voltage divider is connected to terminal 42. A voltage potential of B+ is connected between terminals 42 and 40.

During the trace portion of the vertical oscillator pulse, capacitor 16 discharges through potentiometer 19 and resistor 18 towards ground potential. The discharge rate of capacitor 16 is controlled by the potentiometer 19 and resistor 18.

Figure 4:
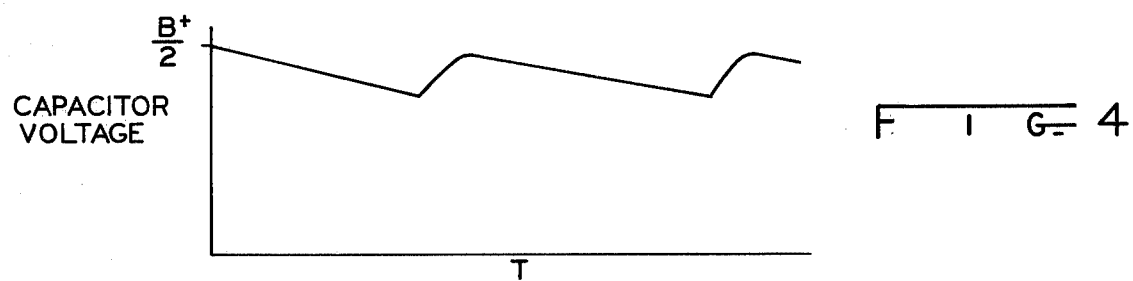
FIG. 4 is an illustration of the voltage across capacitor 16 of the apparatus of FIG. 3.

Referring now to FIG. 4, the capacitor 16 voltage is shown in relation to the trace and retrace intervals established by vertical oscillator pulses. The decreasing voltage waveform is used to provide a decreasing yoke current. The capacitor 16 voltage waveform is slightly bowed due to the capacitor 22.

The capacitor 16 voltage is coupled to the base of transistor 17 where it is thereafter supplied to the base of transistor 20. Transistor 20 provides an amplified capacitor voltage for forcing current through yoke 36.

Figure 5:
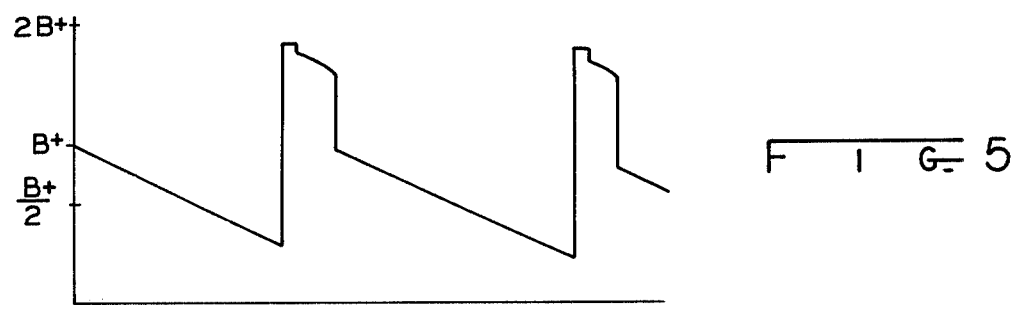
FIG. 5 is an illustration of the voltage provided by the collector of transistor 20 in the apparatus of FIG. 3.

Referring now to FIG. 5, there is shown the amplified voltage waveform at the collector of transistor 20. During the retrace interval, transistor 20 is initially turned off causing the collector voltage of transistor 20 to rise. Transistor 30 becomes fully saturated during retrace causing a potential of 2B+, supplied by retrace circuit 39, to be coupled to terminal 36b of deflection yoke 36.

During the trace portion of the scan cycle, transistors 30 and 23 are operated push-pull as a complimentary current source to provide a current for yoke 36. Resistor 24 is selected to prevent crossover distortion when one transistor stops conducting current and the other begins conducting current. Resistor 25 returns the emitter connection of transistors 30 and 23 to the junction of potentiometer 19 and resistor 18. This provides positive feedback to the generated trace voltage. The feedback corrects for nonlinearity introduced into the yoke driving voltage due to nonlinear circuit components. Bias current is supplied by a second voltage source connected between terminal 41 and terminal 40. This bias source is necessity much higher than B+ and is designated in FIG. 3 as B++. This voltage may be obtained by rectifying the a.c. line voltage found in a television receiver. Those skilled in the art will recognize that other sources of high voltage within a television receiver may be used in place of a rectified line voltage. The rectified line voltage will be much higher than the power supply voltage B+.

During the first half of the trace period, transistor 30 supplies a linearly decreasing current to yoke 36 as shown in FIG. 1. When the voltage at the base of transistor 30 decays to approximately B+/2, zero current is supplied to the yoke 36 since the voltage on terminal 36a is also near B+/2. At this time, transistor 23 begins to conduct current and the voltage at terminal 36b continues to decrease at a faster rate than the voltage at terminal 36a causing current to flow in the opposite direction.

The current through the yoke 36 may be controlled by selecting a proper value of resistor 21. Capacitor 22 is an effective a.c. short, thereby permitting the current level through yoke 36 to be a function of the yoke resistance and the resistance of resistor 21 and the driving voltage appearing across this combination of elements. The driving voltage magnitude may be selected by changing potentiometer 19. This in turn will control the vertical height of the picture generated by the picture tube. Capacitor 15 is included to lessen any tendency the circuit may have to oscillate. At the completion of the trace portion of the scan cycle, the current direction in yoke 36 must be reversed and the magnitude of the current is established to bring the electron beam to the top of the picture tube whereby the next trace may begin. Retrace circuit 39 provides a high voltage across the yoke 36 which causes the deflection yoke 36 current to be reversed.

Retrace circuit 39 comprises a voltage doubler which provides a voltage of 2B+ to the yoke at the conclusion of the trace portion of the scan cycle. Those skilled in the art will recognize that a tripler or other voltage multiplier may be used in place of the doubler. During trace, capacitor 29 is charged to B+ volts through diode 28 and resistor 31. During retrace, transistor 20 is turned off and the current through yoke 36 abruptly changes causing the voltage across the yoke 36 to rise. This rise in voltage causes transistor 34 and transistor 32 to be biased into conduction when the deflection yoke voltage exceeds B+. As the yoke 36 voltage rises towards a voltage of B+ volts, diode 37 and 38 will carry current to the power supply terminal 42. The turn on of transistor 32 causes the voltage across the yoke to be clamped at 2B+. This results from the voltage across capacitor 29 of B+ volts adding algebraically with the voltage B+ supplied by the emitter of transistor 32.

Figure 6:
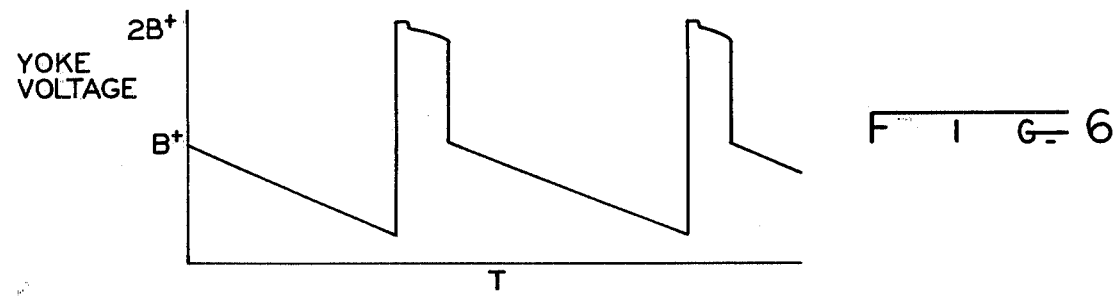
FIG. 6 is a waveform of the voltage across a deflection yoke driven by the apparatus of FIG. 3.

The voltage across the yoke is shown in FIG. 6 during both the trace and retrace periods. The clamping of the deflection yoke 36 voltage at 2B+ causes the current through yoke 36 to rise at a rapid rate returning the beam of the CRT to the top of the screen.

During retrace, the voltage at the emitter of transistor 32 rises to B+ and remains there until the next trace is started. This results in a pulse being produced at the emitter of transistor 32 having a peak amplitude of B+. This pulse is useful for blanking the electron beam during retrace. Components which may be used to to construct the circuit shown in FIG. 3 are given below as follows. These component values are given by way of example only of one of many circuit configurations used to realize the invention.

| | |
|---|---|
| capacitor 11-1 MFD | resistor 25-2,400,000 ohms |
| resistor 12-10,000 ohms | resistor 27-33,000 ohms |
| transistor 13-PNP | diode 28-silicon gp |
| resistor 14-15,000 ohms | capacitor 29-100 MFD |
| capacitor 15-100 MFD | transistor-30 NPN |
| capacitor 16-1 MFD | resistor 31-330 ohms |
| transistor 17-PNP | transistor 32-NPN |
| resistor 18-680,000 ohms | resistor 33-1,000 ohms |
| potentiometer 19-1,000,000 ohms | transistor 34-PNP |
| transistor 20-NPN | resistor 35-180 ohms |
| resistor 21-3.9 ohms | yoke 36-8 ohms, 24 mh |
| capacitor 22-1,000 MFD | diode 37-silicon gp |
| transistor 23-PNP | diode 38-silicon gp |
| resistor 24-120 ohms | |

Thus there is described with respect to one embodiment apparatus for generating a current for a deflection yoke. Those skilled in the art will recognize other embodiments of the invention described more particularly by the claims that follow.

What is claimed is:

1. Apparatus for vertically deflecting an electron beam in a CRT comprising:
   a deflection yoke for generating a magnetic field for vertically displacing said electron beam;
   a d.c. voltage source for providing a first d.c. voltage level;
   means for providing a second d.c. voltage level from said d.c. voltage source having twice the level of said first d.c. voltage;
   a source of vertical oscillator pulses, said pulses defining the beginning and end of a trace period;
   means for generating a linearly changing voltage waveform from said first voltage source in response to a vertical oscillator pulse, said voltage waveform having a peak value equivalent to said first d.c. voltage level and a duration equivalent to a trace period;

means for coupling said voltage waveform to said deflection yoke whereby a linerarly changing current will flow through said deflection yoke causing said yoke to deflect said beam across the face of said CRT; and means for applying said second d.c. voltage level across said deflection yoke at the end of a trace period whereby said beam will be returned to the top of said CRT.

2. Apparatus for supplying a deflecting current to a deflection yoke comprising:

a source of vertical oscillator pulses for indicating the beginning and end of a trace period;

a source of d.c. voltage for providing a first voltage level;

means for doubling said first voltage level to provide a second voltage level;

a timing capacitor for providing a timing voltage waveform which decreases from an initial level with time, said timing voltage being initiated at the beginning of a trace period;

means for supplying an initial d.c. voltage level to said capacitor at the end of a trace period, said initial d.c. voltage being a fraction of said first voltage level;

complementary current source means for providing a linearly decreasing current of a first sense through said deflection yoke during a first portion of said timing voltage waveform, and for providing a linearly increasing current of any opposite sense during the remaining portion of said voltage waveform; and means for applying said second voltage level across said deflection yoke at the conclusion of said trace period.

3. Apparatus for supplying a deflection current to a deflection yoke comprising:

source of vertical oscillator pulses for indicating beginning and end of a trace period;

source of d.c. voltage for providing a first voltage level;

means for multiplying said first voltage level to provide a second voltage level higher than said first voltage level;

complementary current source means operatively connected to said first source of d.c. voltage for providing a linearly decreasing current of a first sense through said deflection yoke during a first portion of said trace period and for supplying a current of opposite sense during the remaining portion of said trace period; and means for applying said second voltage level to said deflection yoke at the end of said trace period whereby the direction of the current through said deflection yoke is rapidly reversed.

4. The apparatus of claim 3 whereby said means for multiplying said first voltage level is a voltage doubler, said voltage doubler having an input operatively connected to said source of d.c. voltage.

5. A deflection circuit for providing a current to a deflection yoke comprising:

a source of vertical oscillator pulses, each of said pulses representing the beginning and end points of a trace period;

means for generating a linearly decreasing voltage waveform during a trace period;

complementary current source means for supplying a linearly decreasing current waveform to said deflection yoke in response to said voltage waveform;

a capacitor for storing a d.c. voltage;

a voltage source;

means for charging said capacitor with said voltage source to a level substantially equal to that of said voltage source;

means for connecting said capacitor in series with said voltage source whereby a source of high voltage substantially equal to twice that of said voltage source is derived; and means for connecting said capacitor-voltage source series combination across said deflection yoke at the conclusion of a trace period whereby a current is produced in said yoke.

* * * * *